(12) United States Patent
Foca et al.

(10) Patent No.: US 11,915,908 B2
(45) Date of Patent: Feb. 27, 2024

(54) METHOD FOR MEASURING A SAMPLE AND MICROSCOPE IMPLEMENTING THE METHOD

(71) Applicant: Carl Zeiss SMT GmbH, Oberkochen (DE)

(72) Inventors: Eugen Foca, Ellwangen (DE); Amir Avishai, Pleasanton, CA (US); Dmitry Klochkov, Schwaebisch Gmuend (DE); Thomas Korb, Schwaebisch Gmuend (DE); Jens Timo Neumann, Aalen (DE); Keumsil Lee, Palo Alto, CA (US)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/501,238

(22) Filed: Oct. 14, 2021

(65) Prior Publication Data

US 2023/0120847 A1  Apr. 20, 2023

(51) Int. Cl.
*H01J 37/24* (2006.01)
*H01J 37/28* (2006.01)

(52) U.S. Cl.
CPC .............. *H01J 37/24* (2013.01); *H01J 37/28* (2013.01)

(58) Field of Classification Search
CPC .. H01J 37/00; H01J 37/02; H01J 37/24; H01J 37/26; H01J 37/28; H01J 37/16; H01J 37/20
USPC ......................................... 250/306, 307, 311
See application file for complete search history.

(56) References Cited

U.S. PATENT DOCUMENTS

| | | | | |
|---|---|---|---|---|
| 2002/0072012 | A1* | 6/2002 | Nakasugi | H01J 37/3174 430/296 |
| 2004/0090619 | A1* | 5/2004 | Choi | G11B 7/0956 356/153 |
| 2007/0023651 | A1* | 2/2007 | Ishitani | G01N 23/225 250/309 |
| 2007/0102620 | A1 | 5/2007 | Bublitz et al. | |
| 2011/0284746 | A1* | 11/2011 | Shimakura | H01J 37/29 250/310 |
| 2013/0134307 | A1* | 5/2013 | Routh, Jr. | H01J 37/077 250/307 |
| 2019/0378679 | A1* | 12/2019 | Ikeda | H01J 37/222 |
| 2020/0041426 | A1 | 2/2020 | Thompson et al. | |
| 2022/0093359 | A1* | 3/2022 | Onderlicka | G06T 11/008 |

(Continued)

FOREIGN PATENT DOCUMENTS

| | | | |
|---|---|---|---|
| CN | 1781049 | 5/2006 | |
| JP | 4723945 | 7/2011 | .............. G03F 1/08 |
| JP | 2012-217909 | 11/2012 | .............. B08B 3/08 |

(Continued)

OTHER PUBLICATIONS

The International Search Report and Written Opinion of the International Searching Authority for International Application No. PCT/EP2022/076232, dated Dec. 13, 2022.

(Continued)

*Primary Examiner* — Jason L McCormack
(74) *Attorney, Agent, or Firm* — Fish & Richardson P.C.

(57) ABSTRACT

The present invention relates to a method for measuring a sample with a microscope, the method comprising the steps of: measuring a tilt of the sample, correcting an orientation of the sample based on the tilt, and scanning the sample.

21 Claims, 7 Drawing Sheets

(56) References Cited

U.S. PATENT DOCUMENTS

2022/0328283 A1* 10/2022 Yang ................ H01J 37/28
2023/0115376 A1    4/2023 Klochkov et al.

FOREIGN PATENT DOCUMENTS

TW         201011278      3/2010
WO    WO 2021/037695     3/2021   .............. G01C 9/00

OTHER PUBLICATIONS

Jasper et al., "Fast Focus-based Depth Detection for Manipulation in Scanning Electron Microscopes", *2011 IEEE International Conference on Automation Science and Engineering*, pp. 375-380 (Aug. 24-27, 2011).
Office Action and Search Report issued by the Taiwan Patent Office for Application No. TW 111136716, dated Aug. 18, 2023 (with English translation).

* cited by examiner

METHOD FOR MEASURING A SAMPLE AND MICROSCOPE IMPLEMENTING THE METHOD

TECHNICAL FIELD

The present invention generally relates to a method for measuring a sample with a microscope, and a microscope implementing said method. More specifically, the method allows for a tilt in the positioning of a sample to be compensated or corrected.

BACKGROUND

In various technical fields it is often necessary and to examine a sample not only on its surface but also throughout its vertical depth. In some cases, this is possible by using imaging devices capable of seeing her through the sample. In some cases, this is not possible, due for instance to the complexity of the sample or the materials thereof.

As an example, semiconductor devices are known in which vertical structures are implemented. The structures might be, for instance, vertical connections or capacitor arrays in so called high aspect ratio (HAR) structure arrangements, etc. It is often interesting to examine how those structures evolve along their vertical direction.

Figure 1A:
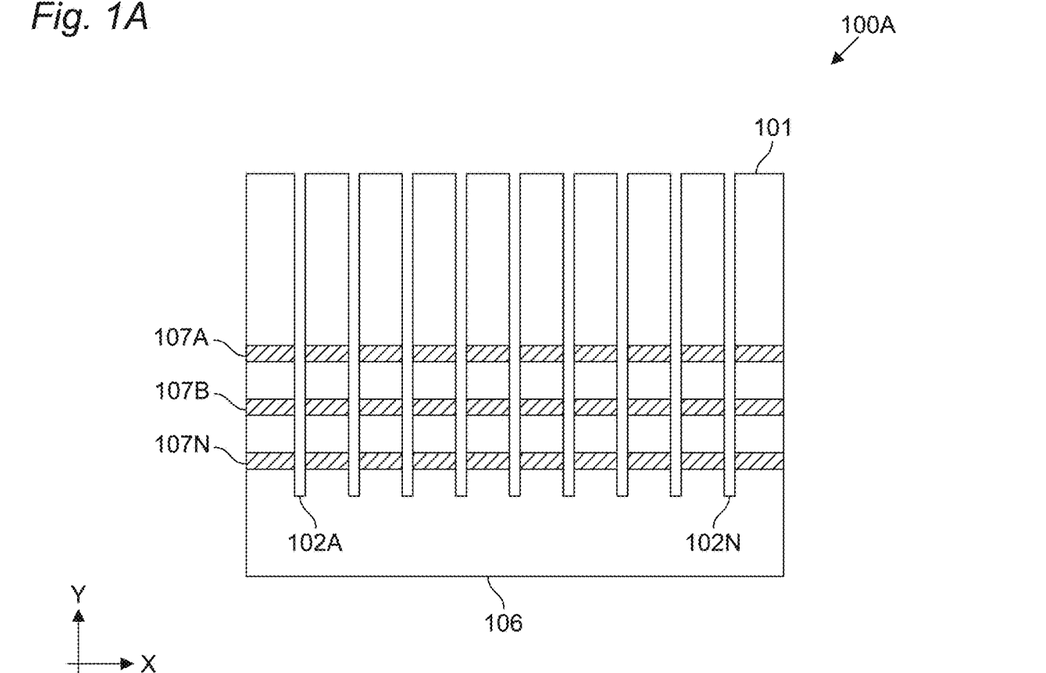
FIGS. 1A-1D schematically illustrate perspective views of a sample 100 for describing phases of a method for measuring the sample, in accordance with the state of the art.

FIG. 1A illustrates an example of such structures. In particular, FIG. 1A schematically illustrates a cross-section of a sample 100A which might be, for instance, a portion of a semiconductor wafer. Sample 100A is provided with a top surface 101, which is usually substantially flat. One or more channels 102A-102N are implemented in the sample. The channels 102A-102N can be etched and left empty for subsequent measuring, as illustrated, or filled with one or more various layers. When realizing such deep and narrow channels, it is difficult to control their vertical orientation across the entire wafer.

It will be understood that other functional elements of sample 100A are not illustrated, for clarity of representation. For instance, the sample 100A might comprise a plurality of horizontal layers 107A-107N implementing various electronical components such as transistors, resistances or capacitors. One exemplary function of the channels 102A-102N could be, for instance, to be filled with electrically conductive material and provide an interconnection among two or more of such layers 107A-107N. It is therefore important that the channel orientation matches the intended orientation, which is usually perpendicular to the wafer surface but not limited thereto, with enough precision. Otherwise, with reference to the exemplary function above, the required contacts to above or below functional units cannot be correctly established. As another example, the channels might be used for implementing capacitor plates, so that misalignment of the channels might result in a capacitance differing from the designed value.

Therefore, controlling the orientation of the channels 102A-102N is important and has dramatic consequences on the manufactured device's yield. The longer the channels 102A-102N become, the more important is to precisely control their characteristics.

Figure 1B:
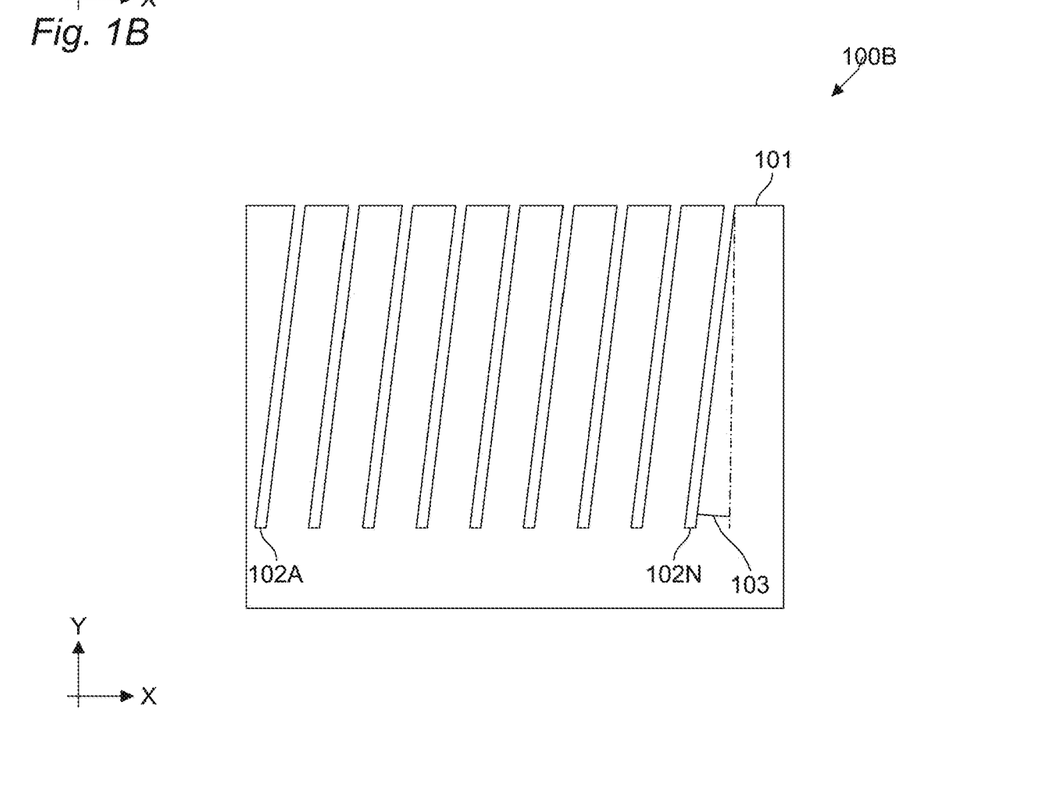

For instance, FIG. 1B schematically illustrates a cross-section of a sample 100B in which the channels 102A-102N present at angle 103 with respect to the vertical direction Y. In order to better control and/or correct the manufacturing process, manufacturers are interested to know whether the situation of FIG. 1A or the situation of FIG. 1B arises from their processes. While the angle 103 is indicated with respect to the vertical direction Y, the top surface 101 of the sample 100 could be, for instance, a wafer surface. In some cases, this surface can be considered as a reference surface against which the channel tilt can be measured with the methods that will be described in the following.

Figure 1C:
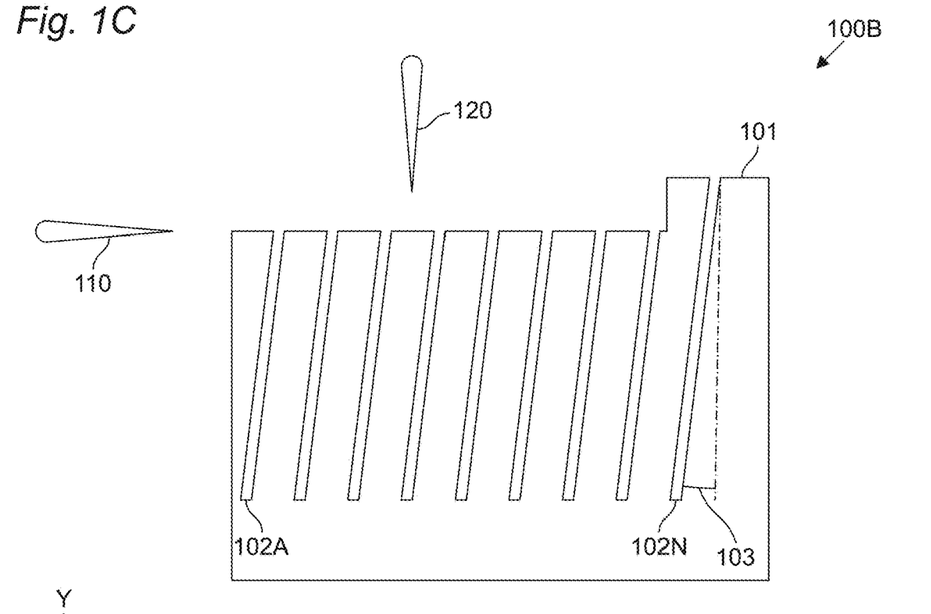

A method has therefore been developed for evaluating the vertical evolution of such channels 102A-102N. As schematically illustrated in FIG. 1C, at least a portion of the top surface 101 of the sample 100B can be removed by use of an etching, or milling, means 110. The etching, or milling, means 110 can be any known type of etching or milling device, for instance a focused ion beam, FIB. The newly exposed top surface of the sample 100B can then be scanned by a scanning means 120, for instance an electron beam in a scanning electron microscope, SEM, a Helium Ion microscope, HIM, or generally a charged particle microscope. Still alternatively, or in addition, a tip in an atomic force microscope, AFM, could be used for the scanning means, or more generally any known type of scanning means, capable of scanning the surface of a sample. Although the milling is shown in FIG. 1C to be substantially parallel to the top surface 101, the invention is not limited thereto and the plane along which the milling is carried out might be slanted with respect to the top surface 101.

By repeating the milling and scanning procedure, it is possible to stepwisely obtain various images at various vertical locations of the sample 100B. By reconstructing a model based on those images, it is possible to determine the vertical evolution of the channels 102A-102N.

However, in order to ensure a correct measurement, it is necessary for the sample 100 to be positioned precisely. For instance, as visible in FIG. 1D, sample 100A, in which the channels 102A-102N are substantially vertically aligned, might be positioned with its top surface 101 presenting an angle 132 with respect to the horizontal surface X, due for instance to the presence of a dust particle 130.

If this is not taken into account, when carrying out the milling and scanning methods described above, the situation in FIG. 1D arises, in which the reconstructed model from the scanning and milling method will show that the channels 102A-102N present an angle 131 with respect to the vertical direction Y.

SUMMARY

Figure 1D:
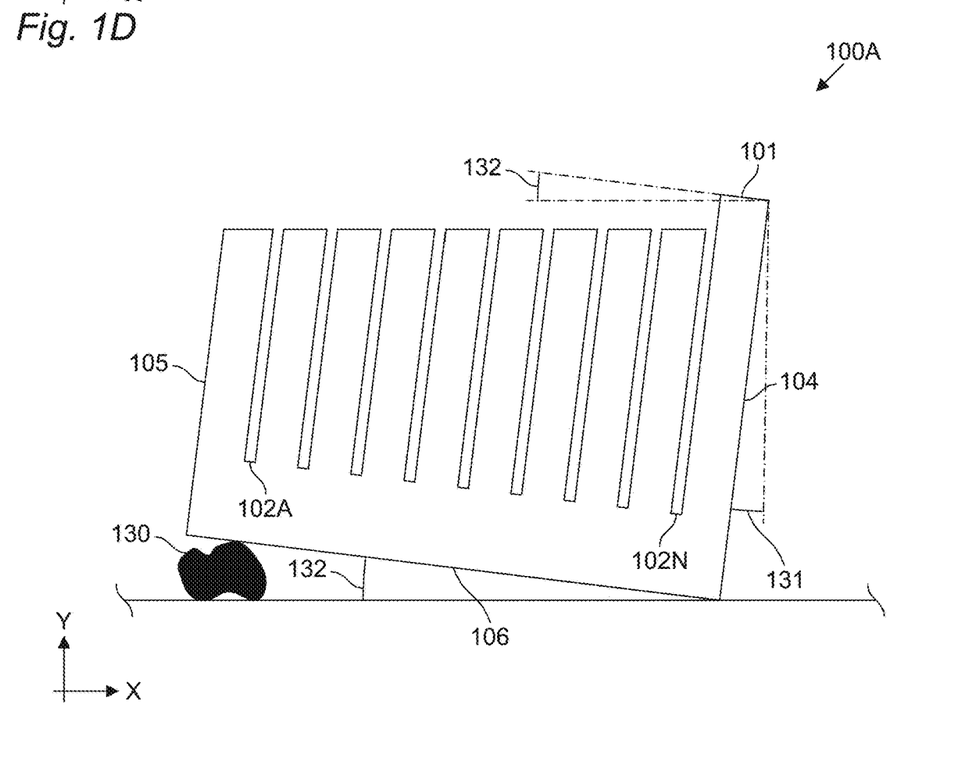

There is thus a need to provide a manner for allowing the microscope to detect the situation of FIG. 1D, in order to enable a correct volume reconstruction of the image sample 100.

This need is met by the features of the independent claims. The features of the dependent claims define further embodiments.

The invention is generally based on the concept that a tilt in the orientation of the sample can be detected and, if necessary, the tilt can be corrected. The correction can be made, for instance, to the position of the sample before scanning the sample, or the sample can be scanned and the subsequent volume reconstruction from cross sectional images can be corrected by taking into account the tilt. Still alternatively, the sample can be etched and/or scanned along a plane corrected by taking into account the tilt.

An aspect can in particular relate to a method for measuring a sample with a microscope, the method comprising the steps of: measuring a tilt 131, 132 of the sample, correcting an orientation of the sample based on the tilt, scanning the sample.

Thanks to this configuration, it is advantageously possible to correct the position of the sample to compensate for the measured tilt.

In some implementations, the method can further comprise the step of checking whether the tilt falls within a predetermined interval.

Thanks to this configuration, it is advantageously possible to avoid a correction of the position of the sample, when no correction is needed, and/or to keep correcting the position of the sample if the previous correction was not sufficient and/or for implementing a stepwise correction method.

An aspect can further relate to a method for measuring a sample with a microscope, the method comprising the steps of: measuring a tilt of the sample, scanning the sample, correcting a volume reconstruction from the scanned images based on the tilt.

Thanks to this configuration, it is advantageously possible to correct the model of the sample created by the volume reconstruction taking into account the tilt, so that the volume model of the sample, for instance a 3D model, is not affected by the effect of the tilt.

An aspect can further relate to a method for measuring a sample with a microscope, the method comprising the steps of: measuring a tilt of the sample, correcting a scanning plane based on the tilt, and scanning the sample.

Thanks to this configuration, it is advantageously possible to measure the sample along a plane which is computed based on the tilt, for instance a plane parallel to the tilt, so that the images resulting from the scanning are compensated for the tilt.

In some implementations, the tilt can comprise at least an angle formed by a predetermined surface of the sample and a predetermined plane.

In some implementations, the predetermined surface can be any of a top surface, a horizontal layer, a side surface, a bottom surface, and the predetermined plane can be a scanning plane of the microscope.

Thanks to this configuration, it is advantageously possible to measure the tilt with respect to a number of surfaces with respect to the scanning plane of the microscope as reference. This enables the subsequent scanning to be performed along the scanning plane while correcting for the tilt as previously described.

In some implementations, the predetermined surface can be any of a top surface, a horizontal layer, a side surface, a bottom surface, and the predetermined plane can be a horizontal plane XZ.

Thanks to this configuration, it is advantageously possible to measure the tilt with respect to a number of surfaces with respect to the horizontal plane as reference. This enables the convenient use of a horizontal plane for the positioning of the sample.

In some implementations, the measuring step can be carried out by focusing a beam on the sample and measuring the resulting focal distance.

Thanks to this configuration, it is advantageously possible to easily and precisely carry out the measuring step.

In some implementations, the beam can be a scanning beam also used for the scanning step.

Thanks to this configuration, it is advantageously possible to use the same beam within the microscope for a plurality of steps.

In some implementations, the focus point can be directed to a focusing marker.

Thanks to this configuration, it is advantageously possible to improve the focusing by appropriately choosing the characteristics of the marker. Moreover, the position of the marker can also be selected so as to achieve a measuring step at a predetermined location of the sample.

In some implementations, the method can further comprise the step of realizing one or more focusing markers.

Thanks to this configuration, it is advantageously possible to realize the markers at selected locations on the sample. The knowledge of the position of those locations might be advantageously used in the measuring step.

In some implementations, the measuring step can be carried out by reflecting a beam on the sample.

Thanks to this configuration, it is advantageously possible to easily and reliably measure the position of the sample. Moreover, the detector receiving the reflected beam can be configured so as to directly indicate when the sample is in a predetermined position, thus allowing the positioning of the sample into the predetermined position by a stepwise correction, which does not need to precisely measure the value of the sample's position.

In some implementations, the measuring step can comprise measuring at least three points of the sample.

Thanks to this configuration, it is advantageously possible to detect a plane corresponding to the tilt, the plane being identified by the three points.

In some implementations, the method can further comprise a step of fitting the measured points to a plane identifying the tilt.

Thanks to this configuration, the tilt plane can be identified by the plane resulting from the fitting.

In some implementations, the measuring step can comprise a step of measuring a predetermined number of points of the sample, a step of fitting the measured points to a plane.

Thanks to this configuration, it is advantageously possible to reduce errors resulting from one or more erroneously measured points.

In some implementations, the measuring step can comprise a step of measuring a plurality of points of the sample, a step of removing one or more of the measured points based on a predetermined threshold, and a step of fitting the measured points to a plane without the removed points.

Thanks to this configuration, it is advantageously possible to remove points resulting from erroneous measurements and thus increase the precision of the tilt's measurement.

In some implementations, the scanning step can comprise a step of removing at least a portion of a top surface of the sample, and a step of scanning the sample.

Thanks to this configuration, it is advantageously possible to stepwisely scan the sample at different heights, thus enabling a subsequent reconstruction of a model of the sample along its depth, or vertical direction.

In some implementations, the method can further comprise the step of measuring vertical structures in the sample.

Thanks to this configuration, it is advantageously possible to determine whether the vertical structures in the sample are oriented as expected, without an error being introduced by the tilt.

In some implementations, the sample can be a semiconductor wafer, or a portion thereof.

Thanks to this configuration, it is advantageously possible to measure the evolution of vertical structures in semiconductor wafers, preferably semiconductor wafers, or portions thereof, such as coupons.

An aspect can further relate to a microscope comprising a processor, and a memory, wherein the memory stores instructions configured to cause the processor to control the microscope so as to execute the method according to any previous claim.

Thanks to this configuration, it is advantageously possible control a microscope so as to achieve any of the above advantages.

An aspect can further relate to a computer program comprising instructions, which, when executed by a processor, are configured to cause the processor to control a microscope so as to execute any of the method steps described above.

BRIEF DESCRIPTION OF DRAWINGS

Throughout the description, reference is made to the figures for ease of understanding, where like reference numerals represent like elements, and in which:

FIG. 2A schematically illustrate a measuring method 200 while FIGS. 2B and 2C respectively schematically illustrate a top view and a side view of a sample 100;

DETAILED DESCRIPTION

Some examples of the present disclosure generally provide for a plurality of circuits or other electrical devices. All references to the circuits and other electrical devices and the functionality provided by each are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices can be combined with each other and/or separated in any manner based on the particular type of electrical implementation that is desired. It is recognized that any circuit or other electrical device disclosed herein can include any number of microprocessors, a graphics processor unit (GPU), integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, any one or more of the electrical devices can be configured to execute a program code that is embodied in a non-transitory computer readable medium programmed to perform any number of the functions as disclosed.

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein can also be implemented by an indirect connection or coupling. A coupling between components can also be established over a wireless connection. Functional blocks can be implemented in hardware, firmware, software, or a combination thereof.

Figure 2A:
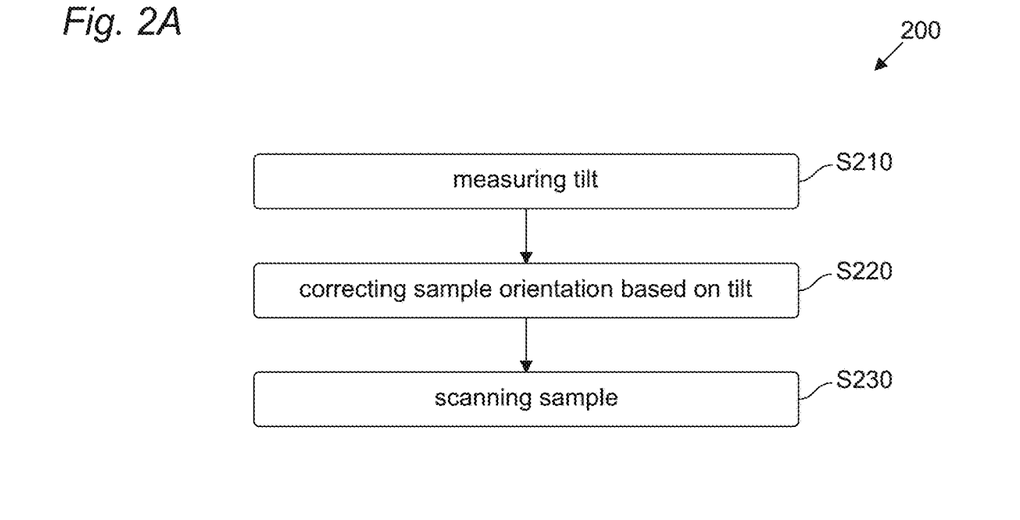
Figure 2B:
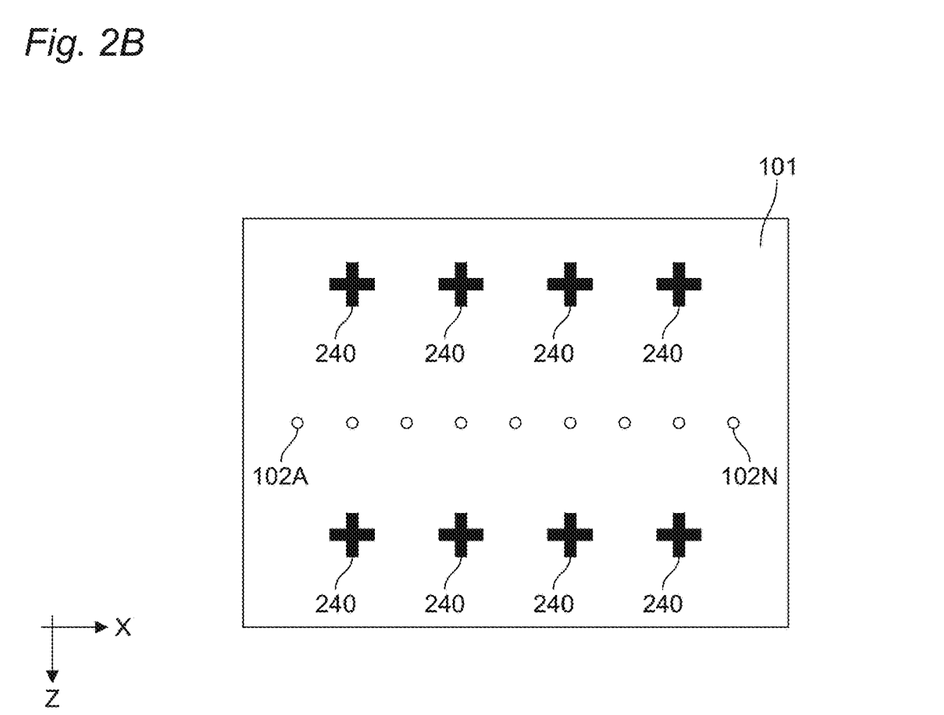
Figure 2C:
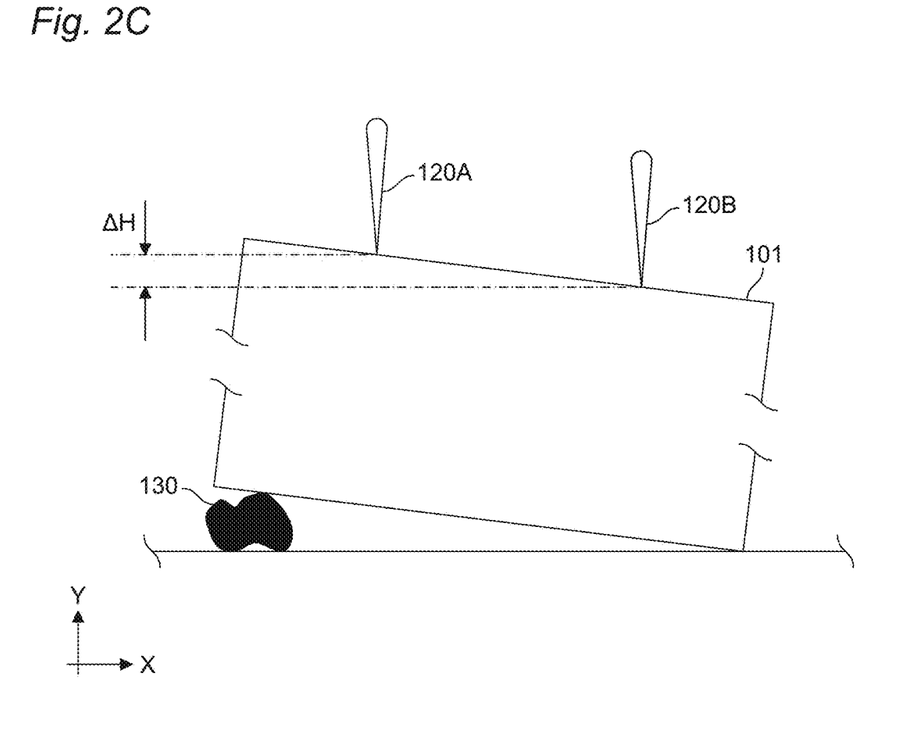

FIG. 2A schematically illustrate a measuring method 200. FIGS. 2B and 2C respectively schematically illustrate a top view and a side view of a sample 100, for further explanation of the method 200 and some optional features.

The method 200 is generally based on the concept of measuring a tilt of the sample 100 and correcting the orientation of the sample based on the tilt before scanning the sample. In some implementations, the sample 100 can be understood as being a portion of a semiconductor wafer which has been cut from the wafer for analysis. This can be referred to as coupon.

In particular, the method 200 comprises a step S210 of measuring a tilt 132 of the sample 100. In general, the tilt can be understood to be any numerical indication that identifies how much a surface of the sample differs with respect to a predetermined plane. The sample can thus comprise at least one angle formed by a predetermined surface of the sample 100 and a predetermined plane. For instance, as visible in FIG. 1D, the tilt 132 can be understood to be an angle between the horizontal plane XZ and a top surface 101, or bottom surface 106, of sample 100. In the context of this application, the top surface 101 can be understood to be a surface substantially aligned with the horizontal plane and on top of the sample 100 when the sample is positioned into the microscope. Preferably, the top surface 101 can be understood to be a part of the top surface which has not yet undergone an etching, or milling, processing for scanning purposes, for scanning purposes by the microscope, for instance as described with reference to step S932 in FIG. 9. However, the present invention is not limited thereto, and, as also visible in FIG. 1D, the tilt 131 could be understood to be an angle between the vertical plane YZ and a side surface 104, 105, of the sample 100. It will be clear that the tilt can be expressed as an angle with a given orientation, or as a combination of angles. For instance, tilt 132 could be described as an angle with respect to the horizontal XZ plane, along a given direction in the XZ plane. Alternatively, or in addition, tilt 132 could be described as a combination of a first angle with respect to the horizontal XZ plane, along the X direction, and a second angle with respect to the horizontal XZ plane along the Z direction. Still alternatively, or in addition, tilt 132 could be described as a plane.

In general, the tilt can be understood to be as indication of a misalignment of a predetermined surface of the sample 100 with respect to a predetermined plane, in the coordinate system of the microscope. In some preferred implementations, the predetermined surface of the sample 100 can be the top surface 101 and the predetermined plane can be a scanning plane of the microscope. The scanning plane can understood to be a plane along which the scanning means 120 are focused by the microscope, at each scanning operation. Alternatively, or in addition, the predetermined surface can be the top surface 101 and the predetermined plane can be the horizontal plane XZ. Those implementations have the advantage of using the top surface 101 as the reference surface of the sample 100. This is particularly advantageous since the sample 100 is generally positioned into the microscope is so that the top surface 101 can be measured. It will however be understood that the present invention is not limited thereto, and other surfaces can be used as reference surface in the sample, such as any of side surfaces 104, 105, or bottom surface 106.

Thanks to the measuring step S210, it is therefore possible to measure the tilt 131, 132, that is, a misalignment, of a predetermined surface of the sample 100 with respect to a predetermined plane. Various manners are known to those skilled in the art in order to measure such a tilt. Two particularly advantageous possible implementations will be described in the following with reference to FIGS. 2B, 2C and 6. For clarity of illustration and explanation, the description will be provided with respect to a tilt measurement based on the top surface 101, it will however be understood that analogous implementations can be obtained by the skilled person with respect to any other surface of the sample 100.

As visible in FIG. 2C, the measuring S210 step can be carried out by focusing a beam, for instance a beam of the scanning means 120, on sample 100 and measuring the respective focusing position, or the focal distance, for instance the focusing height when using the top surface 100 as measurement surface. When a tilt is present, the beam will focus at different points along the vertical direction Y, at corresponding different locations XZ across the sample 100, such as illustrated by beams 120A, 120B. In some implementations, in order to computer the tilt, an absolute value of the focusing height can be measured. Alternatively, or in addition, in some implementations the tilt can be derived by a difference between at least two focusing points, such as illustrated by ΔH. This latter approach has the advantage that it is not necessary to calibrate a height of the focusing with respect to a precise given zero value, since any value chosen as zero will be compensated in computing the difference in height between the various points.

In some preferred implementations, the beam which is used for focusing and measuring the focus point can be a scanning beam 120 also used for the subsequent scanning step S230. This has the advantage that a single equipment within the microscope can be used both to compute and carry out the measuring step S210 and the scanning step S230.

In some preferred implementations, as visible in FIG. 2B, the focus point, that is, the point on which the focusing beam is focused, can be directed to a focusing marker 240. Focusing markers 240 are, in general, structures having a shape and/or other physical characteristics—such as any of materials, surface reflectivity, surface roughness, etc.—that enable, or enhance, an autofocus procedure. Thus, by using one or more focusing markers 240 it is advantageously possible to provide a more precise and/or faster reading of the position of the sample at the corresponding location. Moreover, as will be discussed more in the details in the following with reference to FIG. 5, by positioning the markers 240 at predetermined locations, the predetermined locations can be placed at the predetermined coordinates. Knowledge of those coordinates can be advantageously used in the subsequent determination of the tilt. This, in particular, can allow avoiding a precise measurement of lateral position of the beam 120, along the XZ plane, since the precise positioning can be achieved by autofocusing the beam 120 on the respective marker, the position of which is known with precision.

It will be clear to those skilled in the art that, although the description above has been provided with respect to an optical beam 120 used in order to determine the height of various sample points and thus determine the tilt of the sample 100, the present invention is not limited thereto. The above description is a particularly advantageous for those microscopes employing a beam 120 as scanning means, such as a scanning electron microscope, SEM, a Helium Ion microscope, HIM, or generally a charged particle microscope. The present invention is however not limited thereto and, for instance, instead of focusing a beam 120, the tilt of the sample can be obtained by measuring the height of the sample 100 through contact with a tip of an atomic force microscope AFM.

Figure 6:
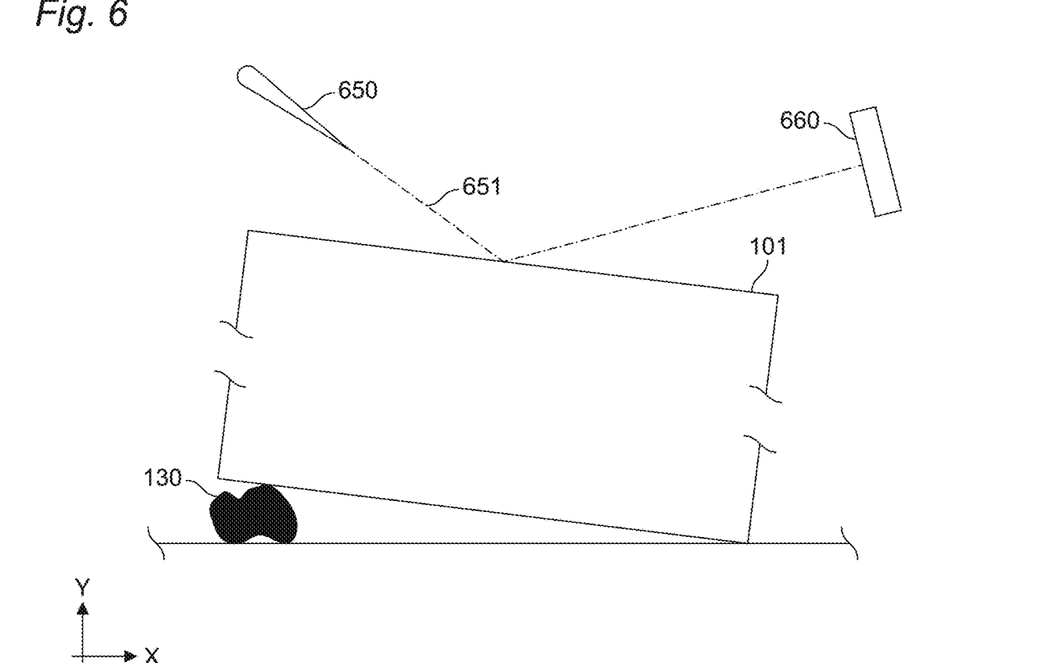
FIG. 6 schematically illustrate a side view of a sample 100 and components for measuring the sample's position.

Still alternatively, or in addition, in some implementations the measuring step S210 can be carried out by reflecting a beam 651 on the sample 100. For instance, as illustrated in FIG. 6, a beam emitter 650 can emit a measuring beam 651 toward the sample 100. A surface of the sample, for instance top surface 101, can reflect the measuring beam 651 toward a detector 660. The detector 660 can be, for instance a multi-quadrant position sensor, such as a four-quadrant position sensor, or more generally any detector which allows to determine an incoming direction and/or position of the reflected measuring beam 651.

As it will be evident, by appropriately controlling the beam emitter 650 and the detector 660, the height of various points along the top surface 101 can thus be measured. Alternatively, or in addition, the orientation of the top surface 101 can be advantageously measured by the beam emitter 650 and the detector 660, thus resulting in an immediate determination of the tilt.

Various manners have thus been described for implementing the measuring step S210 resulting in an identification of a tilt of the sample with respect to a predetermined orientation.

The method 200 can then further comprise a step S220 of correcting an orientation of the sample 100 based on the measured tilt. In particular, the sample can be placed on a support the orientation of which can be controlled so as to compensate for the measured tilt.

In some implementations using the structure illustrated in FIG. 6, the measuring beam 651 can comprise a laser or a focused or collimated LED beam with a predetermined wavelength. In particular, the wavelength can be set as a function of the pitch of the channels 102A-102N. More specifically, the wavelength can be at least 0.2 m, preferably at least 0.5 m larger than the channel pitch, which can be for instance smaller than 0.1 m. In some implementations, the measuring beam can have a diameter larger than the channel pitch, preferably at least 5 times larger, even more preferably at least 10 times larger. By using a beam with a wavelength larger than the channels pitch, the beam will not sample the fine structure but will sense the surface as a kind of effective refractive index. The main signal will be the specular reflex, which is directed to the detector 660. When using a multi-quadrant detector 660 it is the possible to tilt the sample until all quadrants measure substantially the same intensity of the reflected light. This ensures that the surface on which the beam is reflected is at a predetermined orientation with respect to a known coordinate system associated with the emitter 650 and/or with the detector 660.

Although above a specific description has been provided as to how the light signal can be configured so as to allow the reflected light to be hitting more than one quadrant at the time, it is clear that, depending in particular on the configuration of the sample 100, the skilled person will be able to implement several alternatives. In general, it will be sufficient to configure the emitter 650 and/or detector 660 so that a light beam reflected from the sample 100 can cover more than one quadrant of a multi-quadrant detector 660, preferably at least three quadrants, even more preferably at least four quadrants, when the reflecting surface of the sample is positioned in a predetermined orientation. Even more generally, it will be sufficient to configure the emitter 650 and/or detector 660 so that a light beam reflected from the sample 100 can be detected by the detector 660 in a manner that allows the detector 660 to determine, from the detected signal, an orientation of the sample 100.

This predetermined orientation of the reflecting surface can be, before or after the measuring step S210, calibrated with respect to a known reference orientation, such as the horizontal plane or the focusing plane of the microscope. It is thus clear that the predetermined orientation can then be used for computing the tilt with respect to any reference orientation. Alternatively, or in addition, if the emitter 650 and the detector 660 are arranged so that the predetermined orientation correspond to a position of the sample without a tilt with respect to the chosen predetermined orientation, this allows the tilt to be both measured and corrected in a single step, thus implementing both steps S210 and S230.

For instance, the emitter 650 and the detector 660 can be calibrated so that they can ensure a positioning of the sample top surface parallel to a predetermined plane, when the multi-quadrants on the detector 660 receive a substantially equal amount of light per quadrant. It is not necessary to know precisely the orientation of the predetermined plane, as the scanning means 120 can also be calibrated with respect to the same predetermined plane, for instance by using the predetermined plane, or a plane parallel thereto, as scanning plane. Thus, by using a predetermined plane as common reference between the coordinate system of the combination of emitter 650 and of the detector 660, and the scanning means, the sample can be positioned in such a manner to ensure its orientation to be tilt-free for the operation of the scanning means 120.

It has thus been described how the sample can be positioned in a manner that does not include a tilt with respect to a predetermined plane. Thanks to this, even in the presence of dust 130, or generally in the presence of any unexpected cause of a tilt of the sample 100, it is possible to correctly position the sample 100 with respect to the predetermined plane for the subsequent scanning step.

The method 200 can thus further comprise a step S230 of scanning the sample 100. The scanning step can be implemented with any known technology, for instance with a SEM employing scanning means 120, a Helium Ion microscope, HIM, or generally a charged particle microscope, or an AFM, etc. Owing to the tilt-free position of the sample 100 with respect to the predetermined plane, and by using the predetermined plane as reference for the scanning step S230, it is possible to correctly reconstruct the vertical position of the vertical structures within the sample 100, such as the channels 102A-102N.

Figure 3:
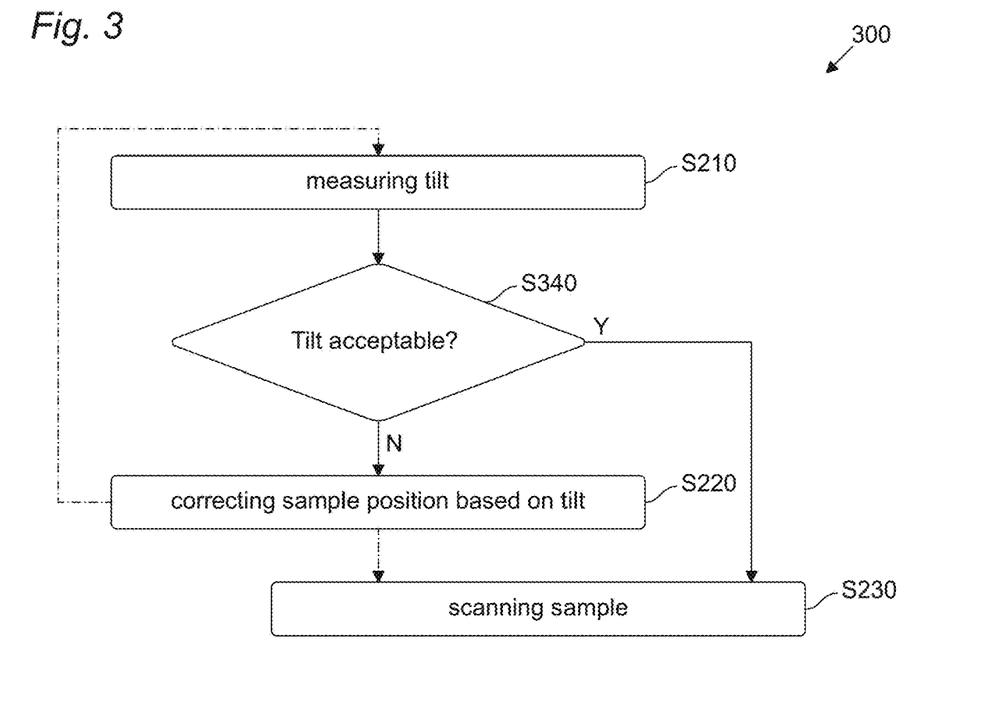
FIG. 3 schematically illustrate a measuring method 300.

In some implementations, as illustrated for instance in FIG. 3, the method 200 that can be modified to comprise an additional step S340 of checking the tilt value. In particular, after measuring the tilt at the step S210, it can be checked whether the value of the tilt of the sample falls within a predetermined interval, such as an acceptable tilt range, or not at step S340. If the determination is that the tilt of the sample falls within the predetermined acceptable range, the method 300 can proceed to the scanning step S230.

On the other hand, if the determination is that the tilt of the sample falls outside of the predetermined acceptable range, the method can proceed to step S220 of correcting the sample position based on the measured tilt. In some implementations, after the correcting step S220, the method 300 can then proceed to the scanning step S230. Alternatively, after the correcting step S220, the method 300 can proceed back to the measuring step S210. This latter approach can thus ensure that the measuring and correcting steps are repeated until the measured tilt falls within an acceptable range. This provides the additional advantage that possible errors during the repositioning of the sample at the correcting step S220 can be compensated for. This might be the case, for instance, when the devices used for repositioning the sample at the correcting step S220 malfunction or are out of specification. Alternatively, or in addition, the sample 100 might slightly move during the repositioning, or the dust 130 might do so, thus causing the tilt to vary in an unexpected manner.

This implementation is also particularly advantageous in case the measuring step S210 is not configured to output precise numerical values of the tilt, but only an indication. For instance, with reference to FIG. 2C, the measuring step could indicate that the point corresponding to the beam 120A is higher than the point corresponding to the beam 120B, without indicating precisely by how much but only indicating that the difference is outside of an acceptable range. This might then be corrected by stepwisely raising the right part of the sample 100, and measuring the tilt again, until the measured tilt falls within the acceptable range.

In the description above, it has been considered that the tilt can be corrected prior to the execution of the scanning step S230. In alternative implementations, such as illustrated by method 400 of FIG. 4, the tilt can be measured at step S210 as previously described. However, instead of repositioning the sample to correct the tilt, the method 400 can proceed to a scanning step S230 of scanning the sample in its tilted orientation.

Figure 4:
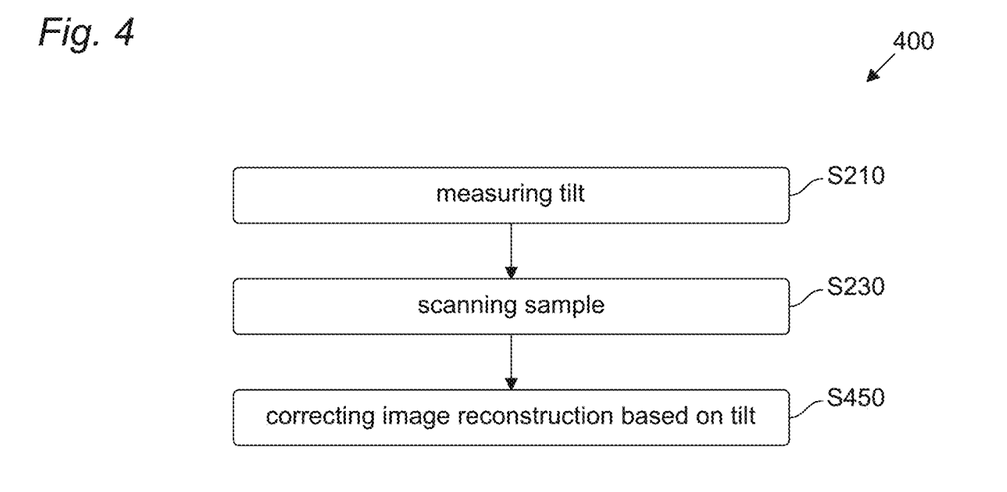
FIG. 4 schematically illustrate a measuring method 400.

The value of the tilt can, in those implementations, be subsequently used for a step S450 of correcting a volume reconstruction based on the images resulting from the scanning step S230. That is, instead of correcting the position of the sample, the volume reconstruction, or the reconstruction of the model of the sample, based on the images resulting from the plurality of scans, can be corrected in order to compensate for the measured tilt. It will be clear to those skilled in the art of that the various image transformations and/or geometric manipulation of the images and/or of the combination of the images can be implemented in order to compensate for the measured tilt. These implementations have the advantage that no repositioning of the sample to correct for the tilt is needed.

Still alternatively, with reference to method 200, instead of correcting the sample orientation based on the tilt, at step S220 a scanning plane and/or an etching, or milling, plane can be corrected based on the tilt.

In particular, the scanning plane can be corrected so as to compensate for the tilt. For instance, the scanning plane can be set to be parallel to a plane defined by the tilt. In specific implementation, the scanning plane can be set so as to be parallel to the tilted top surface 101. Alternatively, the scanning plane can be set to be parallel to a plane along which the top surface 101 is milled, which might not necessarily be parallel with the top surface 101 but might be slanted with respect to top surface 101. The scanning plane can be understood to be a plane along which the microscope scans the sample 100. For instance, in case of an optical microscope, the scanning plane can be a plane corresponding to the focus positions of the microscope, as the sample is scanned. Alternatively, or in addition, in case of an atomic force microscope, the scanning plane can be a plane corresponding to a zero reference position of the measuring tip.

In some implementations, alternatively or in addition to correcting the scanning plane based on the tilt, the sample can be milled along a plane computed based on the tilt. For instance, the milling plane can be set to be parallel to a plane defined by the tilt. In specific implementation, the milling plane can be corrected so as to compensate for the tilt. More specifically, in some implementations, the milling plane can be set so as to be parallel to the tilted the top surface 101, although the invention is not limited to this configuration and the milling plane might be slanted with respect to the tilted top surface 101. The milling plane then can be understood to be a plane along which at least a portion of the top surface of the sample 100 is etched for the purpose of scanning the sample at different depth, such as discussed with reference to FIG. 1C.

It is thus clear that based on the measured tilt of the sample, various possible implementations can be executed so as to obtain a reconstructed model of the sample from a plurality of scans, which compensate for the tilt by repositioning the sample, correcting the scanning plane, or the model reconstruction. In some cases, two or more of those techniques might by implemented together, so as to correct the tilt in part with a first technique and in part with a second, or more, technique.

Figure 10:
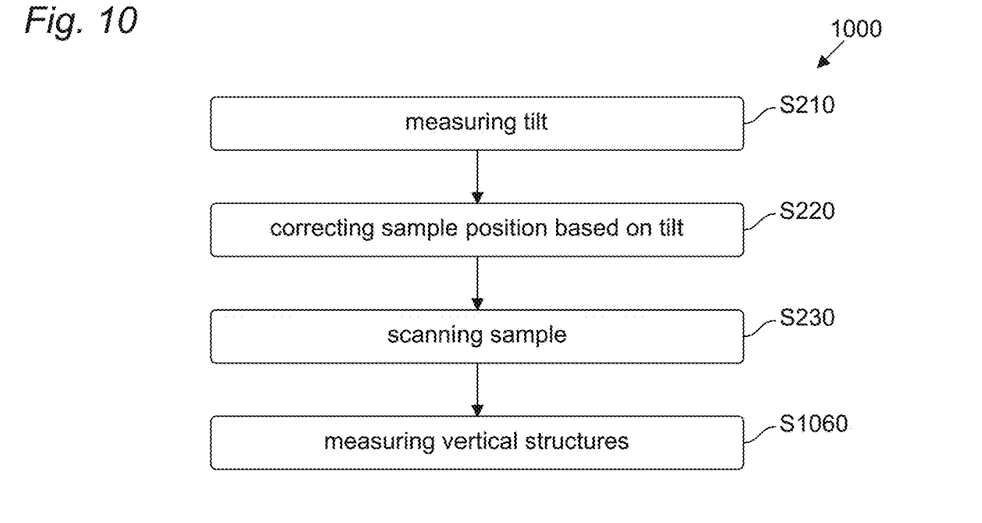
FIG. 10 schematically illustrate a measuring method 1000.

The invention can thus provide a reliable imaging of the evolution of vertical structures, such as the channels 102A-102N, along the vertical direction Y of the sample 100. For instance, as illustrated in FIG. 10, a method 1000 may differ from method 200 due to the presence of a further step S1060 of measuring vertical structures 102A-102N in the sample 100. It is clear that step S1060, illustrated in FIG. 10 as being carried out in conjunction with the method 200, can also be carried out in conjunction with method 300, or more generally with any other method described throughout the application.

By executing step S1060 after the tilt has been corrected, be it by correcting the position of the sample 100, the focusing and/or milling plane, the images, or the image reconstruction, based on the tilt, it is possible to avoid the problems discussed with the prior art.

Figure 5:
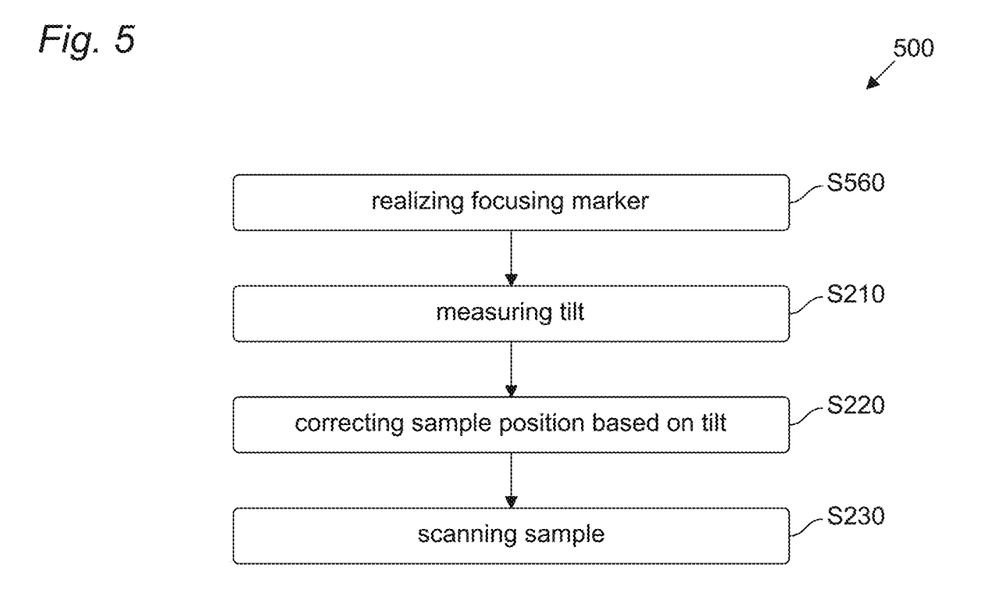
FIG. 5 schematically illustrate a measuring method 500.

FIG. 5 illustrates a further method 500, based on method 200, from which it differs due to the implementation of a step S560 of realizing one or more focusing markers 240, as previously described. By allowing the focusing markers 240 to be implemented prior to the measuring step S210, it is possible to implement focusing markers with characteristics enabling a more efficient autofocus of beam 120, or a desired reflection of beam 651. Also in this case, while method 500 has been described as being based on method 200, for ease of description, it will be clear that step S560 can be combined with any other method described throughout the application.

In the description above, the measuring step S210 has been described as being possibly based on various technological implementations, without any specific limitations on the number of points of the sample 100 which are measured.

In some implementations, the measuring step S210 can be implemented by measuring at least three points of the sample 100. In some implementations, the method can further comprise a step of fitting the measured points to a plane identifying the tilt 131, 132. This allows a determination of a plane defined by the tilt, passing through the at least three points.

Figure 7:
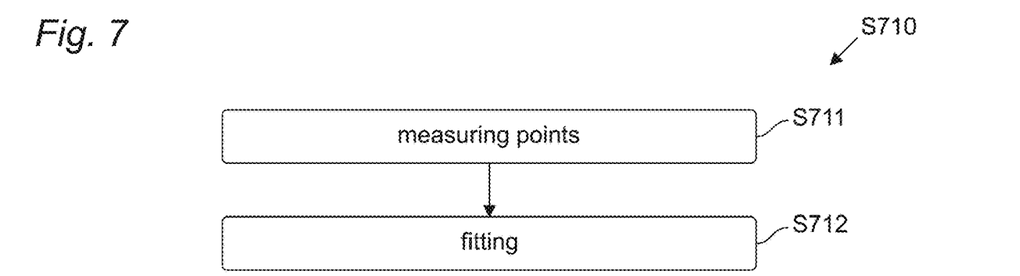
FIG. 7 schematically illustrate a measuring step 710.

Moreover, as illustrated in FIG. 7, a measuring step S710 can comprise a step S711 of measuring a predetermined number of points of the sample 100, and a step S712 of fitting the measured points to a plane. In preferred implementations, the fitting step S712 can comprise fitting the measured points to a plane identifying the tilt, that is, computing a plane which best fits the measured points, based on any known fitting algorithm. Thanks to this approach, the tilt plane, defined by the fitting, can be correctly measured even if some of the measurements are incorrect.

Generally, as the predetermined number of points increases, the precision of the measuring step S711 increases. When measuring the Y coordinates of N points subject to random errors $\Delta Y$, the error of the fitted slope from two points $\Delta$tilt will drop roughly as a function of $\Delta$tilt/sqrt(N). The predetermined number of points N can thus be selected, in some implementations, such that a desired error level is met. In practical embodiments, the number of points N can comprise an array of points, preferably not collinear, even more preferably spanning a plane of maximal enclosed circle diameter. In some implementations, the array can comprise at least 3×3 points.

In some implementations, the result of the fitting step S712 can also provide an indication of the error of the measured points with respect to the fitted plane. For instance, the error might be the average of the distance of the points from the fitted plane, although it will be clear that an indication of the error can be computed in a variety of manners. If the error is found to be higher than a predetermined number, it might be concluded that the measured surface is not sufficiently planar. This indication can be advantageously used as a warning that the sample is not suitable for measurement or that measuring issues are present.

Figure 8:
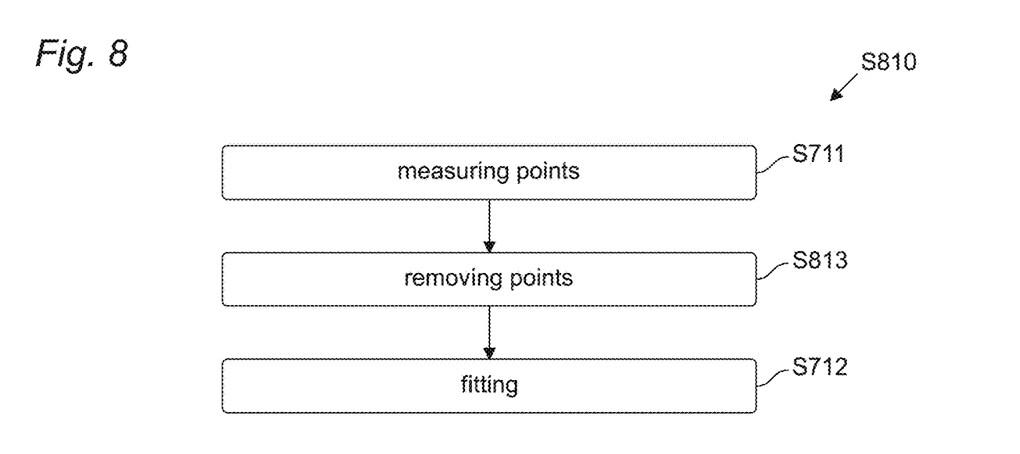
FIG. 8 schematically illustrate a measuring step 810.

Still further, as visible in FIG. 8, a measuring step S810 can additionally comprise a step S813 of removing one or more of a plurality of measured points based on a predetermined threshold. This allows points that are outside of a predetermined range to be excluded from the fitting. This can be referred to as outlier filtering and various algorithms are known for its implementation. Such approach might be particularly useful to allow removal of points that are due to mistakes in measurements and thus differ by a significant amount from the remaining points. It will be clear that a large number of statistical approaches can be implemented for determining which points are to be removed. For instance, the standard deviation of the measured points from a fitting plane can be computed and points that are distanced from such plane by more than a predetermined multiple of the standard deviation can be removed. As an alternative, a random sample consensus, RANSAC, algorithm can be used for implementing step S813. The method 800 can then proceed with a step S712 of fitting the measured points without the removed points.

In the description above, the scanning step S230 has been described as being possibly based on various technological implementations, such as through a SEM, a HIM, or an AFM. As visible in FIG. 9, in some implementations, the scanning step S930 can comprise a step S931 of removing at least a portion of a top surface 101 of the sample 100, and a step S932 of scanning the sample 100, for instance through a SEM, a HIM, or an AFM measurement. The removing, or etching, or milling step can be carried out by any known etching or milling equipment so as to result in the removal of at least a portion of the top surface, for instance as illustrated in FIG. 1C, whereby the removal, or etching, or milling plane can be parallel to the top surface, as illustrated, or slanted. By repeating the steps S931 and S932, the scanning step S930 allows evaluating the vertical evolution of structures throughout the depth, or vertical direction, of sample 100.

Figure 9:
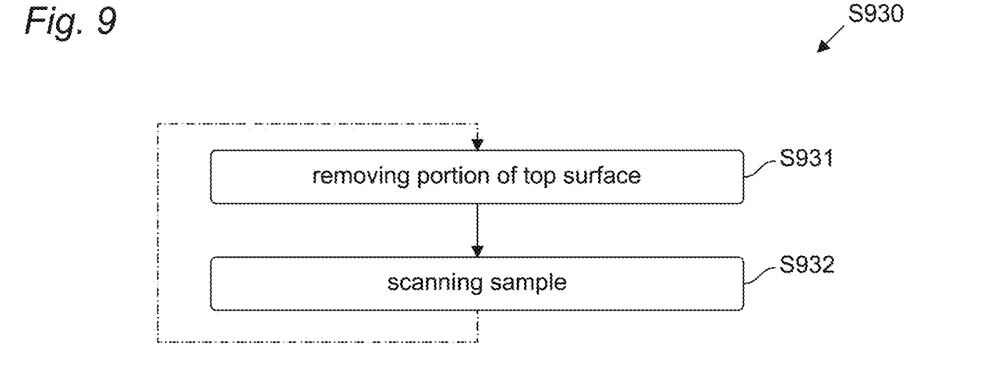
FIG. 9 schematically illustrate a scanning step 930.

In preferred implementations, the surface removal carried out at step S931, as illustrated for instance in FIG. 1C, may be limited to an area which form less than 50% of the top surface 101 of the sample. This has the advantage of leaving enough planar surface around the etched region for subsequent, and/or regular, checking of the sample tilt.

In some implementations, it is thus possible to combine any of the method described for correcting the tilt with method 900. More specifically, it might be possible to execute the method for correcting the tilt every predetermined number of cycles of steps S931, S932.

Although the invention has been so far described as a method, it will be clear that embodiments of the invention can also be implemented in other forms.

Figure 11:
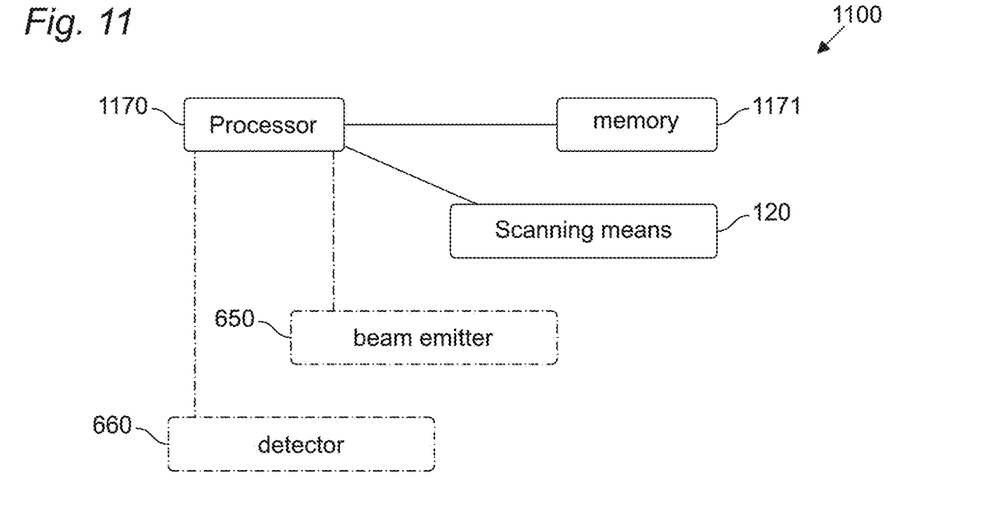
FIG. 11 schematically illustrate a microscope 1100.

In particular, as visible in FIG. 11, a microscope 1100 can comprise a processor 1170, and a memory 1171. The memory 1171 can store instructions configured to cause the processor 1170 to control the microscope 1100 so as to execute any steps of any method described above. In some implementations, the microscope can further comprise any of the scanning means 120, the emitter 650 and the detector 660, as illustrated.

Furthermore, the invention can be embodied by a computer program comprising instruction, which, when executed by a processor, for instance processor 1170, are configured to cause the processor to control a microscope, for instance a microscope 1100 so as to execute the method 200, 400, 400, 500 according to any of claims 1 to 16.

It has thus been described how a microscope and/or a method for controlling a microscope can be used to facilitate reconstruction of a model of the sample, based on a plurality of scanning images taken along its depth. The described embodiments allow in particular the removal of a tilt in the positioning of the sample, so as to result in a reliable scanning workflow.

Although the invention has been shown and described with respect to certain preferred embodiments, equivalents and modifications will occur to others skilled in the art upon the reading and understanding of the specification. The present invention includes all such equivalents and modifications and is limited only by the scope of the appended claims.

LIST OF REFERENCE NUMERALS

100: sample
101: top surface
102A-102N: channels
103: angle
104, 105: side surface
106: bottom surface
107A, 107N: horizontal layers
110: etching means
120: scanning means
130: dust
131: angle
132: tilt
200: method for measuring sample
S210: measuring tilt
S220: correcting sample
S230: scanning sample
240: focusing marker
300: method for measuring sample
S340: checking tilt value
400: method for measuring sample
S450: correcting volume reconstruction
650: beam emitter
651: beam
660: detector
S710: measuring tilt
S711: measuring points
S712: fitting
S810: measuring tilt
S811: measuring points
S813: outlier filtering
S930: scanning sample
S931: removing portion of top surface
S932: scanning sample
1100: microscope
1170: processor
1171: memory
1000: method for measuring sample
S1060: measuring vertical structures

What is claimed is:

1. A method for measuring a sample with a microscope, the method comprising the steps of:
measuring a tilt of the sample,
correcting an orientation of the sample based on the tilt, and
scanning the sample;
wherein the measuring step is carried out by focusing a beam on the sample and measuring the resulting focal distance.

2. The method of claim 1, further comprising the step of checking whether the tilt falls within a predetermined interval.

3. A method for measuring a sample with a microscope, the method comprising the steps of:
measuring a tilt of the sample,
scanning the sample, and
correcting a volume reconstruction from the scanned images based on the tilt;
wherein the measuring step is carried out by focusing a beam on the sample and measuring the resulting focal distance.

4. A method for measuring a sample with a microscope, the method comprising the steps of:
measuring a tilt of the sample,
correcting a scanning plane based on the tilt, and
scanning the sample;
wherein the measuring step is carried out by focusing a beam on the sample and measuring the resulting focal distance.

5. The method of claim 1, wherein the tilt comprises an angle formed by a predetermined surface of the sample and a predetermined plane.

6. The method of claim 5, wherein the predetermined surface is any of a top surface, a horizontal layer, a side surface, a bottom surface, and the predetermined plane is a scanning plane of the microscope.

7. The method of claim 5, wherein the predetermined surface is any of a top surface, a horizontal layer, a side surface, a bottom surface, and the predetermined plane is a horizontal plane.

8. The method of claim 1, wherein the beam is a scanning beam also used for the scanning step.

9. The method of claim 1, wherein the focus point is directed to a focusing marker.

10. The method of claim 1, further comprising the step of realizing one or more focusing markers.

11. The method of claim 1, wherein the measuring step is carried out by reflecting a beam on the sample.

12. The method of claim 1, wherein the measuring step comprises measuring at least three points of the sample.

13. The method of claim 12, further comprising a step of fitting the measured points to a plane identifying the tilt.

14. The method of claim 1, wherein the measuring step comprises
   a step of measuring a predetermined number of points of the sample, and
   a step of fitting the measured points to a plane.

15. The method of claim 1, wherein the measuring step comprises
   a step of measuring a plurality of points of the sample,
   a step of removing one or more of the measured points based on a predetermined threshold, and
   a step of fitting the measured points to a plane without the removed points.

16. The method of claim 1, wherein the scanning step comprises
   a step of removing at least a portion of a top surface of the sample, and
   a step of scanning the sample.

17. The method of claim 1, further comprising the step of measuring vertical structures in the sample.

18. The method of claim 1, wherein the sample is a semiconductor wafer, or a portion thereof.

19. A microscope comprising
   a processor, and
   a memory,
   wherein the memory stores instructions configured to cause the processor to control the microscope so as to execute the method of claim 1.

20. A computer program comprising instructions, which, when executed by a processor, are configured to cause the processor to control a microscope so as to execute the method of claim 1.

21. The method of claim 1, wherein focusing a beam on the sample comprises focusing a charged particle beam on the sample.

* * * * *

UNITED STATES PATENT AND TRADEMARK OFFICE
CERTIFICATE OF CORRECTION

PATENT NO. : 11,915,908 B2
APPLICATION NO. : 17/501238
DATED : February 27, 2024
INVENTOR(S) : Eugen Foca et al.

It is certified that error appears in the above-identified patent and that said Letters Patent is hereby corrected as shown below:

In the Specification

Column 8

Line 47, delete "0.2 m" and insert -- 0.2 µm --

Line 48, delete "0.5 m" and insert -- 0.5 µm --

Line 49, delete "0.1 m" and insert -- 0.1 µm --

Signed and Sealed this
Twenty-third Day of April, 2024

Katherine Kelly Vidal
*Director of the United States Patent and Trademark Office*